US008586936B2

(12) United States Patent
Yang et al.

(10) Patent No.: US 8,586,936 B2
(45) Date of Patent: Nov. 19, 2013

(54) HYBRID ANODE FOR SEMICONDUCTOR RADIATION DETECTORS

(75) Inventors: Ge Yang, Moriches, NY (US); Aleksey E. Bolotnikov, South Setauket, NY (US); Giuseppe Camarda, Farmingville, NY (US); Yonggang Cui, Miller Place, NY (US); Anwar Hossain, Middle Island, NY (US); Ki Hyun Kim, Middle Island, NY (US); Ralph B. James, Ridge, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 172 days.

(21) Appl. No.: 13/099,001

(22) Filed: May 2, 2011

(65) Prior Publication Data

US 2011/0272589 A1    Nov. 10, 2011

Related U.S. Application Data

(60) Provisional application No. 61/330,438, filed on May 3, 2010.

(51) Int. Cl.
*H01L 27/146* (2006.01)
*G01T 1/24* (2006.01)
*G01T 5/06* (2006.01)
*H01L 27/14* (2006.01)

(52) U.S. Cl.
USPC ............. 250/370.13; 250/370.01; 250/336.1; 257/428

(58) Field of Classification Search
USPC ............. 250/370.13, 370.01, 336.1; 257/428, 257/E31.086
See application file for complete search history.

(56) References Cited

U.S. PATENT DOCUMENTS

| 6,175,120 B1 | 1/2001 | McGregor et al. |
| 7,728,304 B2 * | 6/2010 | Chen et al. ............... 250/370.13 |
| 8,063,378 B2 * | 11/2011 | Bolotnikov et al. ..... 250/370.01 |

OTHER PUBLICATIONS

Barrett, H., et al., "Charge transport in arrays of semiconductor gamma-ray detectors," *Phys. Rev. Lett.*, 75 (1), p. 156-159, (1995).
Bolotnikov, A., et al., "New results from performance studies of Frisch-Grid CdZnTe detectors," in Hard X-Ray and Gamma-Ray Detector Physics VI, edited by Burger, A., et al., *Proc. of SPIE*, 5540, pp. 33-45, (SPIE Bellingham, WA, 2004).
Bolotnikov, A., et al., "Performance characteristics of Frisch-Ring CdZnTe detectors," *IEEE Trans. Nucl. Sci*, 53, n.2, pp. 607-614, (2006).
Montemont, G., et al., "A capacitive Frisch Grid structure for CdZnTe detectors," *IEEE Trans. Nuci. Sci*, 48, pp. 278-281, (2001).
Parnham, K., et al., "Performance improvement of CdZnTe detectors using modified two-terminal electrode geometry," in SPIE conference on Hard X-Ray, Gamma-Ray, and Neutron Detector Physics, *Proc. of SPIE*, 3768, pp. 49-54 (Denver, CO 1999).
Ramo, S., "Currents induced by electron motion," *Proc .of the IRE* 27, pp. 584-585, (1939).

(Continued)

*Primary Examiner* — David Porta
*Assistant Examiner* — Faye Boosalis
(74) *Attorney, Agent, or Firm* — Dorene M. Price

(57) ABSTRACT

The present invention relates to a novel hybrid anode configuration for a radiation detector that effectively reduces the edge effect of surface defects on the internal electric field in compound semiconductor detectors by focusing the internal electric field of the detector and redirecting drifting carriers away from the side surfaces of the semiconductor toward the collection electrode(s).

23 Claims, 3 Drawing Sheets

(56) References Cited

OTHER PUBLICATIONS

Schockley, W., "Currents to conductors induced by a moving point charge," *J. Appl. Phys.* 9, pp. 635-636, (1938).

Szeles, C. et al., "Fabrication of high performance CdZnTe quasi-hemispherical gamma-ray CAPture Plus detectors," in Hard X-Ray and Gamma-Ray Detector Physics VIII, edited by Franks, L., et al., *Proc. of SPIE*, 6319, pp. 191-198 (SPIE, Bellingham, WA, 2006).

Wright, G., et al., "Effects of surface roughness on large-volume CdZnTe nuclear radiation detectors and removal of surface damage by chemical etching," in Hard X-Ray and Gamma-Ray Detector Physics V, edited by Franks, L., et al., *Proc. SPIE*, 5198, pp. 306-313, (SPIE, Bellingham, WA, 2004).

\* cited by examiner

HYBRID ANODE FOR SEMICONDUCTOR RADIATION DETECTORS

CROSS-REFERENCE TO A RELATED APPLICATION

This application claims the benefit under 35 U.S.C. 119(e) of U.S. Provisional Application No. 61/330,438 filed on May 3, 2010, the content of which is incorporated herein in its entirety.

STATEMENT OF GOVERNMENT LICENSE RIGHTS

This invention was made with Government support under contract number DE-AC02-98CH10886, awarded by the U.S. Department of Energy. The Government has certain rights in the invention.

BACKGROUND

I. Field of the Invention

The present invention relates to the manufacture of devices for the detection of high-energy electromagnetic radiation. More particularly, the present invention relates to the manufacture and use of a hybrid anode structure for high-spectral resolution radiation detectors based on CdZnTe, CdTe, CdMnTe, $HgI_2$, TlBr, or other semiconductors capable of operating as single-carrier-transport devices.

II. Background of the Related Art

Semiconductor nuclear radiation detectors have experienced a rapid development in the last few years. They are now used in a large variety of fields, including nuclear physics, X-ray and gamma ray astronomy, and nuclear medicine. Their imaging capabilities, good energy resolution, and the ability to fabricate compact systems are very attractive features, in comparison with other types of detectors, such as gas detectors and scintillators. In recent years, a substantial effort has been invested in developing a range of compound semiconductors with wide band gap and high atomic number for X-ray and gamma ray detectors. These compound semiconductors are generally derived from elements of groups III and V, e.g. GaAs and groups II and VI, e.g. CdTe of the periodic table. However, besides binary compounds, ternary materials have been also produced, e.g. CdZnTe and CdMnTe. Among these compound semiconductors, cadmium telluride (CdTe) and cadmium zinc telluride (CdZnTe) are two of the most promising materials for radiation detectors with good energy resolution, high detection efficiency, and room temperature operation.

Nonetheless, the poor hole transport properties of the compound semiconductor materials are a critical issue in the development of X-ray and gamma ray detectors. Hole trapping reduces the charge collection efficiency of the detectors and produces an asymmetric long tail in the photopeaks of the measured spectra (hole tailing). Several methods have been proposed to minimize this effect. Among them is the development of detectors based on the collection of the electrons (single charge carrier sensing detectors or unipolar detectors), which have better transport properties than that of the holes.

One of the drawbacks of the single charge carrier sensing techniques, however, is the edge-related effects. Ideally, a detector should have uniform spectral response over the whole area. However, in detectors with a large geometrical aspect ratio (a length to width ratio), such as, but not limited to, CAPture™ (K. Parnham, et al., in *Hard X-Ray, Gamma-Ray and Neutron Detector Physics, Proceedings of SPIE*, 1999; incorporated herein by reference in its entirety), hemispherical, (C. Szeles, et al., in *Hard X-Ray and Gamma-Ray Detector Physics VIII*, edited by Larry A. Franks, et al., *Proceedings of SPIE* Vol. 6319 (SPIE, Bellingham, Wash., 2006); incorporated herein by reference in its entirety), and Frischring, (U.S. Pat. No. 6,175,120 to McGregor et al. and G. Montemont, et al., *IEEE Trans. Nucl. Sci*, Vol. 48, pp. 278-281, 2001; each of which is incorporated herein by reference in its entirety), the electron clouds traveling along their drift paths can arrive at side surfaces of a detector before reaching the collecting contact(s). It is known in the art that the surfaces of these semiconductors have high concentrations of defects that trap a significant fraction of the electrons from the clouds that are generated close to the side surfaces, or edges. This effect degrades the performance of semiconductor detectors by reducing the charge collection efficiency near the detector's edges and changing the local electric field directions. That is, a fraction of the electric field lines intersect the detector's side surfaces instead of extending to the anode. Therefore, the carrier drift-lines can be terminated by the side surfaces before reaching the collecting electrodes, resulting in a signal loss for interacting events near the edges. FIG. 1A illustrates a cross-sectional view of the virtual Frisch-grid detector according to Montemont (2001) and Bolotnikov (*IEEE Trans. Nucl. Sci*, 53(2), 607-614, 2006; incorporated herein by reference in its entirety). In contrast, in detectors with small aspect ratios such effects are still present but the contribution is small due to the fact that relatively small fractions of the events interact near the device edges.

A schematic of a virtual Frisch-grid detector of the Prior Art is shown in FIG. 1A. The virtual Frisch-grid detector 100 comprises a compound semiconductor 102 having a first surface and a second surface, an anode 108 connected to the first surface of the semiconductor 102, and a cathode 101 connected to the second surface of the semiconductor 102. As shown, the virtual Frisch-grid detector 100 further comprises a virtual Frisch-grid type metal shield 104 surrounding the perimeter of the semiconductor 102 between the anode 108 and the cathode 101. The virtual Frisch-grid detector 100 further comprises a side insulating layer 103 between the surface of the semiconductor 102 and the virtual Frisch-grid metal shield 104. FIG. 1B is an enlarged view of a section near the anode 108 of the detector 100. In this configuration, the ideal electric field lines near the edges of the semiconductor, as shown in FIG. 1C, are parallel with the side surfaces. However, extended defects near the edges of the compound semiconductor distort the electric field, bending it toward the side surfaces, causing electrons to drift to the surface where they recombine and reduce the energy resolution of the system.

A similar problem exists in multielectrode detectors, e.g., pixel detectors (H. H. Barrett, et al., *Phys. Rev. Lett.* 75 (1), p. 156, 1995; incorporated herein by reference in its entirety). In such cases, the electrons can be trapped by the bare surface between the electrodes. In previous designs, special electrodes (steering electrodes) have been placed between the anodes to steer electrons towards the contacts and away from the bare surfaces. A high negative bias (with respect to the anodes) has to be applied to the electrodes to achieve the steering effect.

The fact that the electric field lines may intersect the bare surface is attributed to the surface conductivity. If the semiconductor surface were not conductive this would create the boundary conditions at which the electric field lines stay always parallel to the surface. In real semiconductors, however, the surface conducts and this causes the electric field lines to be terminated on the surface between the contacts.

Therefore, it may be desirable to have a detector configuration that effectively reduces the edge effect on the electric field and improves energy resolution in moderately to substantially thick detector crystals.

SUMMARY

Having recognized that the conventional semiconductor detectors such as, but not limited to, CAPture™, hemispherical, Frisch-ring, pixel, planar, and coplanar grid (CPD) detectors, have a common problem that affects their spectroscopic performances, i.e., the edge effect of surface defects on the electric field, a novel anode structure is provided to effectively reduce the edge effect on the electric field in semiconductor detectors and, therefore, improve energy resolution.

In one embodiment, as illustrated in FIGS. 3A and 3B, a semiconductor detector comprises a semiconductor capable of operating as a single-carrier-transport device. The semiconductor has a first surface and a second surface, an anode assembly connected to the first surface (or bottom) of the semiconductor, and a cathode connected to the second surface (or top) of the semiconductor. The anode assembly comprises a small area metal anode in direct contact with the first surface of the semiconductor, an insulating layer with a hole therethrough, which is aligned with the small area metal anode, and a full area metal anode. Generally the small area electrode will be disposed in the center of the first surface of the semiconductor, but such placement is not required.

The full area metal anode is deposited on top of the insulating layer and connected to the small area anode through the hole in the insulating layer. The present edge effect reduction is accomplished by a small area metal anode, which effectively focuses the electric field and helps to redirect the drifting electrons away from the side surfaces of the detector, thereby increasing charge collection efficiency near the edge of the detector. The smaller the size of the area contacting the anode, the stronger the effect of focusing, or bending, the electric field lines is expected to be. However, not all the field lines reach the material-contacting electrode. Some of them, although having been focused, still terminate at the surface. Thus for some interaction events, the electron clouds will be driven first to the surface and then the charge will leak away to the contact. Without an extended-area contact over the insulator portion of the hybrid anode, the generated signals will have significantly reduced amplitudes. Such events are usually called incomplete charge collection (ICC) events. The extended anode eliminates this problem. As soon as the electron cloud arrives close to the contact surface it generates the full signal on the anode because the insulating layer is very thin (10-100 μm). To generate the full signal the charge needs only to approach the anode. Eventually the charge will be slowly collected by the contacting portion of the anode or will recombine near the surface.

In a preferred embodiment, the present anode assembly is applied to a radiation detector such as, but not limited to, a pixel detector (H. H. Barrett, et al., 1995), a CAPture™ detector (K. Parnham, et al., 1999), a hemispherical detector (C. Szeles, et al., 2006), or a Frisch-ring detector (U.S. Pat. No. 6,175,120; G. Montemont, et al., 2001). It is also envisioned that the present anode assembly can be applied to a virtual Frisch-grid detector as disclosed in commonly assigned co-pending U.S. Provisional patent application entitled "Array of Virtual Frisch-Grid Detectors with Common Cathode and Reduced Length of Shielding Electrodes," the content of which is incorporated herein by reference in its entirety. It is common practice to refer to this family of detectors as the virtual Frisch-grid detectors, and such practice is followed throughout this specification. It should be noted, however, that the present anode may be employed in radiation detectors that do not employ a virtual Frisch grid. For example, the same hybrid anode can be used in pixel detectors (3D devices) to eliminate charge trapping in the gaps between the pixels. This approach eliminates the interposing grid used to steer the electrons towards the pixel contacts. The proposed hybrid anode structure may also be used to advantage with planar or coplanar grid detectors.

In one embodiment, the size of the small area metal anode in the detector is sufficient to cause reduction of the edge effect by focusing the electric field and redirecting the drifting electrons away from the side surfaces of the semiconductor. In another embodiment, the size of the small area metal anode in the detector is smaller than the surface area of the first (or bottom) surface of the semiconductor, and the surface of the full area metal anode is the same as or greater than the surface area of the first surface of the semiconductor. In yet another embodiment, the full area metal anode plays substantially the same role as the regular anode in the virtual Frisch-grid detectors of the prior art, while the small area metal anode notably reduces the edge effects by focusing the electric field. As a result, without being bound by the theory, the anode design of the instant application provides better energy resolution and is believed to access a larger fraction of the active volume of the radiation detector by increasing the charge collection.

In one embodiment, the radiation detector further comprises a virtual Frisch-grid type metal shield surrounding the semiconductor between the first and the second surface. The metal shield may either span the full length from the first surface to the second surface of the semiconductor, or less than full length from the first surface to the second surface of the semiconductor.

In another embodiment, the virtual Frisch-grid detector further comprises a side insulating layer between the side surfaces of the semiconductor and the virtual Frisch-grid metal shield.

In still another embodiment, the semiconductor in the virtual Frisch-grid detector is made from a compound semiconductor selected from CdZnTe (cadmium zinc telluride), CdTe (cadmium telluride), CdMnTe (cadmium manganese telluride), $HgI_2$ (mercury iodide), or TlBr (thallium bromide). Since both CdZnTe and CdMnTe are alloys, their formulae should more properly be written $Cd_{1-x}Zn_xTe$ and $Cd_{1-x}MnTe$, respectively, where $0 \leq x \leq 1$. However, common practice in the industry is to omit the alloy subscripts unless a particular composition is intended; such is the practice that is followed throughout this specification.

The present anode assembly can be used in the context of detector arrays, such as a virtual Frisch-grid detector array made of a plurality of the present virtual Frisch-grid detectors and a radiation detector system fabricated with said virtual Frisch-grid detector array, front-end electronics circuitry such as, but not limited to, an application-specific integrated circuit (ASIC), connected to the virtual Frisch-grid detector array for receiving a signal from said array, and a microprocessor connected to, for example, the ASIC for operating the ASIC. The virtual Frisch-grid detector array encompassing the present anode assembly is configured in a matrix of m by n, where m and n independently represent the number of rows and columns that may range from 1 to 1000 or more detectors. While there is no specific requirement of how the plurality of virtual Frisch-grid detectors must be presented in the array, in one exemplary embodiment, the array is a 4×4 matrix with 4 rows and 4 columns (16 detectors in an array). In another embodiment, the array is an 8×8 matrix (64 detectors in an array). It is also envisioned that detectors of different types may be combined to form a hybrid array depending on specific requirements of the system.

A method is also provided for the manufacturing of a virtual Frisch-grid detector array comprising (a) providing a plurality of virtual Frisch-grid detectors with an anode assembly made from a small area metal anode in direct contact with the first surface of the semiconductor, an insulating layer with a hole therethrough, which is aligned to match the small area metal anode, and a full area metal anode; the virtual Frisch grid spanning the entire length of the compound semiconductor; and (b) bonding the virtual Frisch-grid detectors of step (a) to a conductive board to form an array module.

In one embodiment, the act of bonding is selected from a group consisting of: indium bump bonding, a conductive epoxy bonding, a gold stump bonding, and a combination thereof. In another embodiment, the detectors are bonded in a pattern by forming a plurality of detectors separated by a gap or by forming a plurality of detectors separated by a gap and a grid.

The objectives, features, and advantages of the present anode assembly will be apparent from the following detailed description, which is to be read in conjunction with the accompanying drawings. The scope of the invention will be pointed out in the claims.

The following drawings, taken in conjunction with the subsequent description, are presented to enable one of ordinary skill in the art to make and use the invention and to incorporate it in the context of particular applications. Various modifications, as well as a variety of uses in different applications, will be readily apparent to those skilled in the art, and the general principles, defined herein, may be applied to a wide range of embodiments. Thus, the invention is not intended to be limited to the embodiments presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

DETAILED DESCRIPTION

Certain embodiments of the present anode assembly are directed to (1) a hybrid anode assembly designed for a radiation detector that effectively reduces the edge effect of electric field in such a detector; (2) a virtual Frisch-grid detector with the present hybrid anode assembly; (3) a detector array fabricated with a plurality of virtual Frisch-grid detectors that have the present hybrid anode assembly; and (4) a radiation detector system that comprises, inter alia, a detector array fabricated with a plurality of virtual Frisch-grid detectors that have the present hybrid anode assembly that effectively improves the energy resolution of the system.

Figure 3:
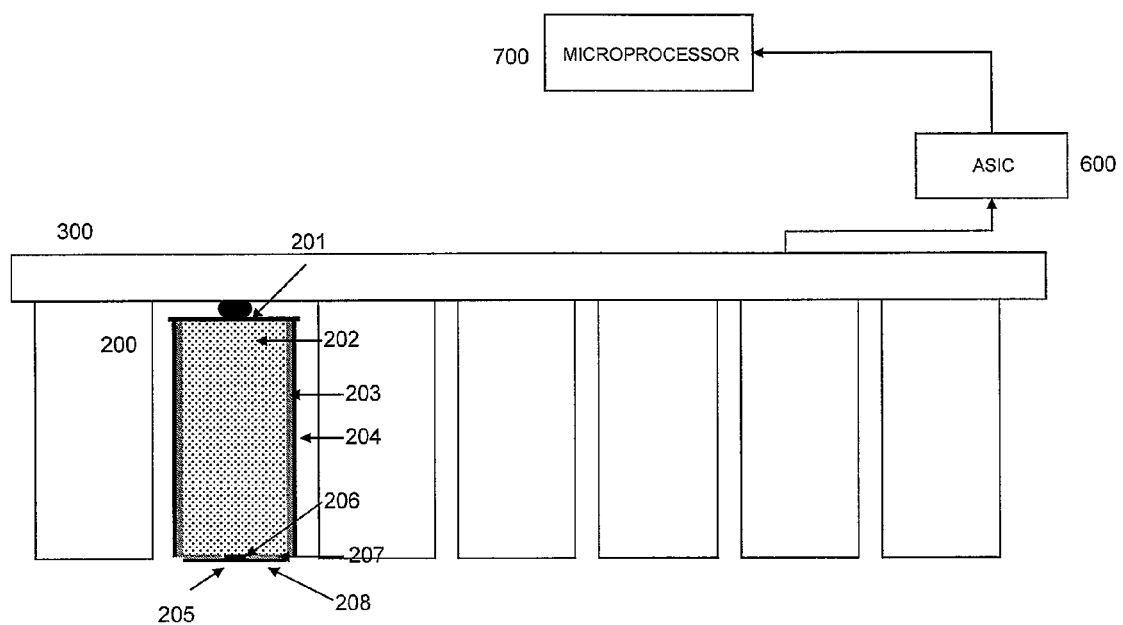
FIG. 3 illustrates a block diagram of a radiation detector system which comprises an interconnected virtual Frisch-grid detector array, an application-specific integrated circuit (ASIC), and a microprocessor.

As shown in FIG. 3, the radiation detector system, in one embodiment, comprises a virtual Frisch-grid detector array 300 made of a plurality of virtual Frisch-grid detectors 200, an application-specific integrated circuit (ASIC) 600 connected to the virtual Frisch-grid detector array 300 for receiving a signal from said array, and a microprocessor 700 connected with the ASIC 600 for operating the ASIC, where signals are received by the array 300, passed through the ASIC 600, and processed by the microprocessor 700. The configuration and components of the radiation detector system are discussed in detail herein below.

(1) A Virtual Frisch-Grid Detector

Figure 2A:
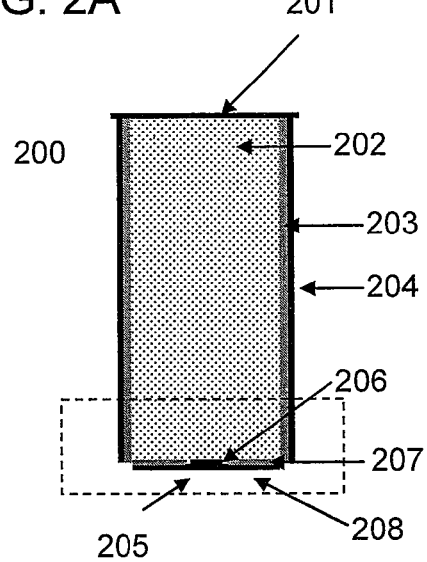
FIG. 2A illustrates a cross-sectional view of a virtual Frisch-grid detector with an anode assembly composed of a small anode plate, an insulating layer with an opening for the small anode plate, which is connected to a standard anode plate.

In one embodiment, without being bound by a theory, it was determined that when the anode contact area is small, the electric field is focused toward the anode contact area and the drifting electrons are redirected away from the side surfaces, reducing the edge effects. A schematic of a virtual Frisch-grid detector of such embodiment is shown in FIG. 2A. The virtual Frisch-grid detector 200 in FIG. 2A comprises a compound semiconductor 202 capable of operating as a single-carrier-transport device.

The compound semiconductors that may be presently employed are generally derived from compounds of elements of groups III and V (GaAs, InP, AlSb), collectively known as Group III-V semiconductors, and groups II and VI (CdTe, ZnSe), collectively known as Group II-VI semiconductors, of the periodic table. Besides binary compounds, ternary materials also may be used as the compound semiconductors capable of operating as a single-carrier-transport, e.g., $Cd_{1-x}Zn_xTe$ and $Cd_{1-x}Mn_xTe$, where $0 \leq x \leq 1$. It is common practice to omit the fractional subscripts when referring to the alloy families; such is the practice followed hereinafter. Among these compound semiconductors and their alloys, in one embodiment, cadmium telluride (CdTe), cadmium zinc telluride (CdZnTe), cadmium manganese telluride (CdMnTe), thallium bromide (TlBr), or mercury iodide ($HgI_2$) is used. However, it will be appreciated and understood by those skilled in the art that any compound, element, or alloy may be used as long as it is capable of operating as single-carrier-transport device. In one particular embodiment, the semiconductor 202 is made from a CdZnTe crystal available from eV Microelectronics (373 Saxonburg Blvd., Saxonburg, Pa. 16056). One skilled in the art will appreciate that the semiconductor may be larger or smaller and vary in shape depending upon the design specifications. In one embodiment, the size of the semiconductor 202 is limited by the availability of a single crystal of highly uniform compound semiconductor. In another, non-limiting, embodiment, the semiconductor 202 is about 6 mm by about 6 mm by 15 mm thick. In yet another, non-limiting, embodiment, the semiconductor 202 is about 7 mm by 7 mm by 20 mm thick, or 5 mm by 5 mm and 10 to 12 mm thick.

As presented in FIG. 2A, the compound semiconductor 202 has a first surface and a second surface. The present anode assembly 205 is connected to the first surface of the semiconductor 202, and a cathode 201 connected to the second surface of the semiconductor 202. In one, non-limiting, embodiment, the cathode 201 and the anode assembly 205 are made from platinum or other conducting material known in the art. In a preferred embodiment, the virtual Frisch-grid detector 200 further comprises an optional virtual Frisch-grid type metal shield 204 surrounding the semiconductor 202 between the first and the second surface. Although in FIG. 2A, the virtual Frisch-grid 204 spans the full length, i.e., 100%, from the first surface to the second surface of the semiconductor 202, it is also envisioned that the virtual Frisch-grid 204 may span less than full length of the semiconductor 202. (See, e.g., Montemont, 2001; Bolotnikov, 2006.) The compound semiconductor detector 200 may be designed without a virtual Frisch-grid type metal shield 204 as known in the Art.

The virtual Frisch-grid detector 200 further comprises a side insulating layer 203 between the surface of the semiconductor 202 and the virtual Frisch-grid 204. The non-contacting virtual Frisch-grid detector eliminates grid-to-anode leakage current while still achieving single-carrier performance (see U.S. Pat. No. 6,175,120). In one embodiment, the insulating layer is from about 1 mm to about 5 mm. In another embodiment, the insulating layer is from about 2 mm to about 3 mm. In yet another embodiment, the insulating layer is about 2 mm. It will be appreciated by those skilled in the relevant art that the thickness of the insulating layer depends on the size of the crystal. For example, in one embodiment, the insulating layer is from about 3 mm to about 5 mm for a 15 mm long crystal.

Figure 1A:
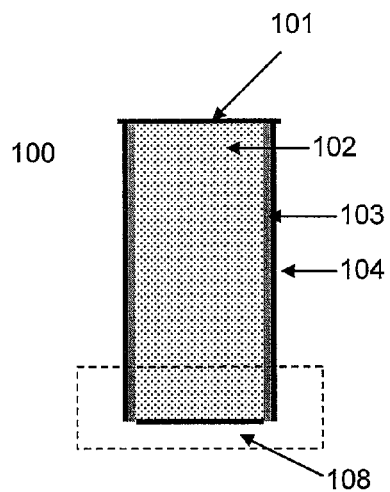
FIG. 1A illustrates a cross-sectional view of a prior art virtual Frisch-grid detector with a single anode plate.
Figure 1B:
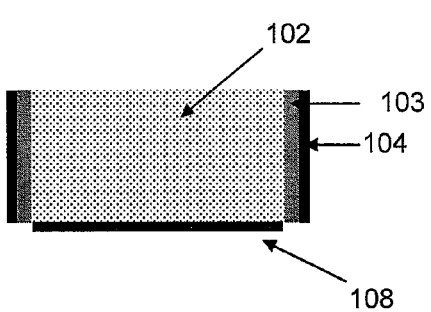
FIG. 1B illustrates an enlarged view of a section near the anode of the virtual Frisch-grid detector with a single anode plate according to FIG. 1A.
Figure 2B:
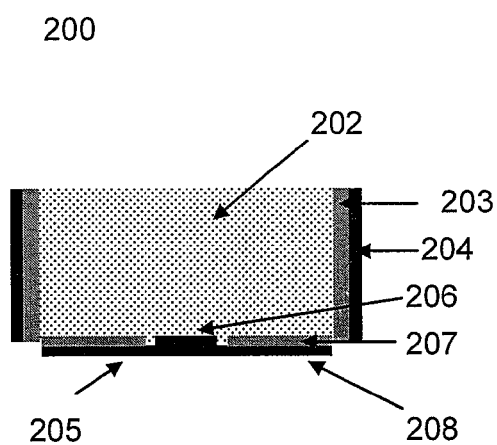
FIG. 2B illustrates an enlarged view of a section near the anode assembly of the virtual Frisch-grid detector according to FIG. 2A.

FIG. 2B is an enlarged view of a section near the anode assembly 205 of the detector 200. The anode assembly 205 comprises a small area metal anode 206 in direct contact with the first surface of the semiconductor 202, an insulating layer 207 with a hole therethrough, which is aligned to match the small area metal anode 206, and a full area metal anode 208, similar to the anode 108 in FIG. 1A or 1B, positioned on top of the insulating layer 207 and connected to the small area anode 206 through the hole in the insulating layer 207. The width of the insulating layer should be the same as or similar to the width of the small anode in order to allow an unhindered contact between the small area metal anode 206 and the full area metal anode 208. The present edge effect reduction is accomplished by a small area metal anode 206, which focuses the electric field and helps to redirect the drifting electrons away from the side surfaces as shown in FIG. 2C.

In one embodiment, the size and shape of the small area metal anode 206 in the virtual Frisch-grid detector 200 are sufficient to cause the edge effect reduction by focusing the electric field and redirecting the drifting electrons away from the side surfaces of the semiconductor 202. While the shape of the exemplified small area anode 208 is round, it is also envisioned that the shape may take any geometric shape, such as square, without losing the effectiveness of causing the edge effect reduction. In one embodiment, the surface area of the full area metal anode 208 is about the same as the surface area of the first surface of the semiconductor 202, whereas the surface size of the small area metal anode 206 is smaller than the surface area of the full area metal anode 208. In another embodiment, the size of the small area metal anode 206 is about 1% to about 90% of the surface area of the first surface of the semiconductor 202. In still another embodiment, the size of the small area metal anode 206 is about 10% to about 50% of the surface area of the first surface of the semiconductor 202. In yet another embodiment, the size of the small area metal anode 206 is about 10% to about 33% of the surface area of the first surface of the semiconductor 202. In one particular embodiment, if the semiconductor 202 is about 6 mm by about 6 mm by 14 mm, the surface area of the first surface of the semiconductor 202 is 36 mm$^2$ (6 mm×6 mm), and the small area metal anode 206 may range from about 0.36 mm$^2$ to about 32.4 mm$^2$ (1 to 90% range). In one particular embodiment, the size of the small area metal anode 206 is about 1 to 2 mm by about 1 to 2 mm.

Figure 2C:
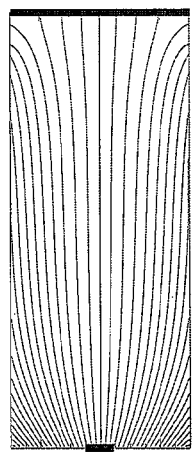
FIG. 2C illustrates a focusing electric field scheme in the virtual Frisch-grid detector of the anode assembly with a small anode according to FIG. 2A.

In one embodiment, it should be understood that the full area metal anode 208 plays substantially the same role as the anode 108 in the virtual Frisch-grid detector 100 as shown in FIG. 1B, or any other similar bar-type radiation detector, while the small area metal anode 206 notably reduces the edge effects by the focusing effect of the electric field (see FIG. 2C). As a result, the present anode design provides better energy resolution and is believed to access a larger fraction of the active volume than traditional anode designs.

EXAMPLES

The example set forth below also serves to provide further appreciation of the invention but is not meant in any way to restrict the scope of the invention.

CdZnTe crystals were purchased from eV Microelectronics, Inc. (373 Saxonburg Blvd., Saxonburg, Pa. 16056). The crystals were re-shaped into bar detectors with geometric parameters 6 mm by 6 mm by 12 mm. Fabrication of the bar-shaped CZT detectors was conducted as described in Bolotnikov, et al. (*Proc. SPIE*, vol. 5540, 33-45, 2004, incorporated herein by reference in its entirety). The original crystals were hand polished and etched briefly with a 2% bromine/methanol solution. A gold (Au) contact was applied to the top surface of the CdZnTe crystal having the surface area substantially the same as the top surface area of the CdZnTe crystal, thereby forming the cathode contact. Then, we deposited a small area Au contact, i.e. a dot, on the CdZnTe crystal bottom surface to form a small area anode that would produce a focusing effect of the electric field. Next, we attached a polyester-type insulating layer to the CdZnTe bottom to cover the whole bottom surface area of the crystal. The attached insulating layer had a hole in the center, which was aligned to match the small metal contact. Furthermore, we deposited another full area metal contact on this insulating layer. In this way, both the small area metal contact and the full area metal contact are connected in the middle part of the contacts.

Afterwards, the side surfaces were polished further to reduce side-surface leakage current. To improve the device performance, the side surfaces of some of the samples were treated with a $NH_4F/H_2O_2$ solution (Wright, et al., *Proc. SPIE*, vol. 5198, pp. 306-313, 2004, incorporated herein by reference in its entirety). After the bar-shaped crystals were fabricated, their side surfaces were wrapped in Teflon® tape followed by Cu tape. During the measurements, the detector under test was placed inside a standard eV Microelectronics device holder (Bolotnikov, 2004) or a custom-made test box having similar features to the standard eV Microelectronics device holder.

Figure 1C:
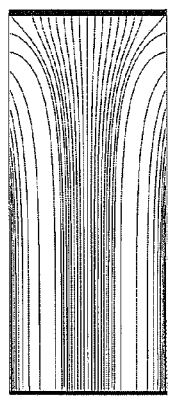
FIG. 1C illustrates a focusing electric field scheme in the virtual Frisch-grid detector with a single anode plate according to FIG. 1A.

Since the anode signal is only proportional to the induced electrons from the Frisch-grid end to the anode (*S. Ramo, Proc. IRE* 27, p. 584, 1939; W. Shockley, *J. Appl. Phys.* 9, p. 635, 1938; each of which is hereby incorporated herein by reference in its entirety), the full area metal contact played almost the same role as the regular anode in current virtual Frisch-grid CdZnTe detector designs, while the small area metal contact notably reduced the edge effects by the focusing the electric field. For the currently known virtual Frisch-grid detector design as shown in FIG. 1C, the ideal electric field lines near the edges are parallel with the side surfaces. In this case, extended defects will distort the electric field toward the side surfaces, causing electrons to drift to the surface where they recombine and their contribution to the total signal lost. However, when the anode contact area is small, the electric field is focused toward the anode contact and helps to redirect the drifting electrons away from the side surfaces, reducing the edge effects as shown in FIG. 2C. As a result, the novel anode design provided better energy resolution and potentially accessed a larger fraction of the active volume.

It will be appreciated by persons skilled in the art that the invention is not limited to what has been particularly shown and described hereinabove. Rather, the scope of the invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent. Furthermore, all references, publications, U.S. patents, and U.S. patent application Publications cited throughout this specification are hereby incorporated by reference as if fully set forth in this specification.

The invention claimed is:

1. A radiation detector comprising
a semiconductor capable of operating as a single-carrier-transport device having a first surface and a second surface opposite the first surface;
an anode assembly connected to the first surface of the semiconductor; and
a cathode connected to the second surface of the semiconductor,
wherein the anode assembly comprises a small area metal anode in direct contact with the first surface of the semiconductor, a thin insulating layer with a hole therethrough in contact with the first surface of the semiconductor,
wherein the hole is aligned with the small area metal anode, and a full area metal anode positioned adjacent to the insulating layer and connected to the small area anode through the hole in the insulating layer.

2. The radiation detector of claim 1, wherein the semiconductor is selected from the group consisting of Group III-V semiconductors and Group II-VI semiconductors.

3. The radiation detector of claim 2, wherein the semiconductor is made from binary compounds.

4. The radiation detector of claim 2, wherein the semiconductor is made from ternary compounds or alloys.

5. The radiation detector of claim 1, wherein the semiconductor is selected from the group consisting of CdZnTe, CdTe, CdMnTe, $HgI_2$, and TlBr.

6. The radiation detector of claim 1, further comprising a virtual Frisch-grid type metal shield surrounding an outer side surface of the semiconductor between the first and the second surfaces.

7. The radiation detector of claim 6, wherein the metal shield spans a full length from the first surface to the second surface of the semiconductor.

8. The radiation detector of claim 6, wherein the metal shield spans less than a full length from the first surface to the second surface of the semiconductor.

9. The radiation detector of claim 6, further comprising an insulating layer between the outer side surface of the semiconductor and the metal shield.

10. The radiation detector of claim 1, wherein the small area metal anode is sufficiently small to effectively focus an electric field internal to the semiconductor and redirect drifting electrons away from side surfaces of the semiconductor.

11. The radiation detector of claim 1, wherein an energy resolution of a pulse-height spectra produced by said radiation detector is less than 2%.

12. The radiation detector of claim 1, wherein the small area metal anode is smaller than a surface area of the first surface of the semiconductor, and a surface area of the full area metal anode is the same as or greater than the surface area of the first surface of the semiconductor.

13. A virtual Frisch-grid detector comprising
a semiconductor selected from the group consisting of CdZnTe, CdTe, CdMnTe, $HgI_2$, and TlBr capable of operating as a single-carrier-transport device having a first surface and a second surface opposite the first surface,
a length defined between said first and second surfaces, and side surfaces along its length;
an anode assembly connected to the first surface of the semiconductor that comprises a small area metal anode in direct contact with the first surface of the semiconductor, an insulating layer with a hole therethrough, which is aligned to match the small area metal anode, and
a full area metal anode positioned on top of the insulating layer and connected to the small area anode through the hole in the insulating layer;
a cathode connected to the second surface of the semiconductor;
a virtual Frisch-grid type metal shield surrounding the semiconductor between the first and the second surface; and
a side insulating layer between the side surfaces of the semiconductor and the virtual Frisch-grid type metal shield.

14. The virtual Frisch-grid detector of claim 13, wherein the metal shield spans the length of the semiconductor.

15. The virtual Frisch-grid detector of claim 13, wherein the metal shield spans less than the length of the semiconductor from the first surface.

16. The virtual Frisch-grid detector of claim 13, wherein the small area metal anode is sufficiently small to effectively focus the electric field and redirect the drifting electrons away from side surfaces of the semiconductor.

17. The virtual Frisch-grid detector of claim 13, wherein the small area metal anode is smaller than a surface area of the first surface of the semiconductor, and a surface area of the full area metal anode is the same or greater than the surface area of the first surface of the semiconductor.

18. A virtual Frisch-grid detector array comprising a plurality of the virtual Frisch-grid detectors of claim 13 arranged in a matrix configuration.

19. A radiation detector system comprising
the virtual Frisch-grid detector array of claim 18;
an application-specific integrated circuit (ASIC) connected to the virtual Frisch-grid detector array operable to receive a signal from said array; and
a microprocessor connected with the ASIC operable to control the ASIC.

20. An anode assembly for a radiation detector comprising
a first contact electrically connected to a side of the detector;

a second contact electrically connected to the first contact; and an insulator interposed between the first and second contacts, the insulator having a hole therethrough through which the first and second contacts come into electrical contact, the first contact having an area from about 1% to about 90% that of an area of the side of the detector, and the second contact having an area larger than that of the first contact and at least 90% that of the area of the side of the detector.

21. The anode assembly of claim 20, wherein the area of the first contact is about 1% to about 33% of the area of the side of the detector.

22. The anode assembly of claim 21, wherein the area of the first contact is about 4% to about 16% of the area of the side of the detector.

23. The anode assembly of claim 20, wherein the area of the first contact is about 1 mm$^2$ to about 4 mm$^2$.

* * * * *